United States Patent [19]

Egawa et al.

[11] 4,209,797
[45] Jun. 24, 1980

[54] COMPLEMENTARY SEMICONDUCTOR DEVICE

[75] Inventors: Hideharu Egawa, Tokyo; Koji Matsuki, Yokohama; Yasoji Suzuki, Ayase, all of Japan

[73] Assignee: Tokyo Shibaura Denki Kabushiki Kaisha, Japan

[21] Appl. No.: 922,192

[22] Filed: Jul. 5, 1978

[30] Foreign Application Priority Data

Jul. 4, 1977 [JP] Japan .................................. 52-79045

[51] Int. Cl.² .................. H01L 27/02; H01L 27/12; H01L 29/04
[52] U.S. Cl. ........................................ 357/42; 357/49; 357/59; 357/91
[58] Field of Search ........................... 357/42, 59, 91

[56] References Cited

U.S. PATENT DOCUMENTS

| Re. 29,660 | 6/1978 | Armstrong | 357/42 |
|---|---|---|---|
| 3,447,046 | 5/1969 | Cricchi et al. | 357/42 |
| 3,759,763 | 9/1973 | Wang | 357/42 |
| 3,821,781 | 6/1974 | Chang et al. | 357/42 |
| 3,853,633 | 12/1974 | Armstrong | 357/91 |
| 3,855,008 | 12/1974 | Huber et al. | 357/91 |
| 3,912,559 | 10/1975 | Harigaya et al. | 357/42 |
| 3,919,008 | 11/1975 | Iwamatsu | 357/42 |
| 4,097,314 | 6/1978 | Schlesier et al. | 357/42 |

OTHER PUBLICATIONS

Lin et al., "Shielded silicon gate complementary MOS integrated circuit", IEEE Trans. Electron Devices, vol. ED-19, (11/72), pp. 1199–1207.

Primary Examiner—Gene M. Munson
Attorney, Agent, or Firm—Finnegan, Henderson, Farabow, Garrett & Dunner

[57] ABSTRACT

A complementary semiconductor device includes P- and N-type semiconductor regions separately formed in a semiconductor substrate and having substantially the same concentration of impurities. The N- and P-channel type silicon gate field effect transistors are formed in the P- and N-channel type regions, respectively. Gate electrodes of the P- and N-channel type silicon gate field effect transistors are formed by polycrystalline silicons of the same conductivity type. An impurity of the same conductivity type is doped into both the semiconductor regions to provide channel doped regions.

11 Claims, 15 Drawing Figures

COMPLEMENTARY SEMICONDUCTOR DEVICE

BACKGROUND OF THE INVENTION

I. Field of the Invention

This invention relates to a semiconductor device and a complementary type silicon gate field effect semiconductor in which P-and N-channel type silicon gate field effect transistors are formed on the same substrate.

II. Description of the Prior Art

In a complementary type silicon gate field effect semiconductor integrated circuit device (hereinafter referred to as a silicon gate CMOS.IC), the threshold voltages of P channel and N channel type field effect transistors are so set as to satisty the requirements as to the threshold voltage of the circuit, operation speed, power consumption etc. Usually, the threshold voltages of the transistors are lowered to a range of 0.8 to 2.0 volts within which the lower power consumption property of the CMOS.IC, is not affected.

An impurity of predetermined conductivity type is doped into the channel region (i.e. channel doping) below the gate electrode of each transistor to control the impurity concentration of the channel region of each transistor. In this way, the threshold voltages of transistors are controlled to a desired value. For example, an island-like P-type region is conventionally formed in an N-type silicon substrate and an impurity, such as phosphorus, is doped by channel doping in that portion of an island-like P-type regin and of N-type silicon substrate where a channel region of the transistor is formed. In this way, channel doped layers are formed. Then, an impurity, such as boron, is doped in the N-type silicon substrate to form source and drain regions. In this case, a gate oxide film on that portion of the semiconductor structure corresponding to the channel region and polycrystalline silicon layer overlying the gate oxide film are used as a mask for diffusion. Thus, a P-channel type silicon gate field effect transistor is formed. Likewise, an impurity such as phos-phosphorus is doped into the island-like P-type region with the gate oxide film and polycrystalline silicon layer as a mask to form source and drain regions. Thus, an N-channel type silicon gate field effect transistor is formed.

If the thickness of the gate oxide film, fixed positive charge, and impurity concentration of the polycrystalline silicon layer are determined, then the threshold voltage of the respective transistors is unconditionally determined by the impurity concentration of regions (i.e. island-like P-and N-type regions) in which each transistor is formed. Since the channel doped layer is formed to shift the threshold voltage of the respective transistors to a desired level, impurities at a specified concentration are doped in the channel region. It is advantageous from the standpoint of manufacturing considerations to simultaneously form channel doped layers, but the conventional method has the following disadvantages.

Figure 1:
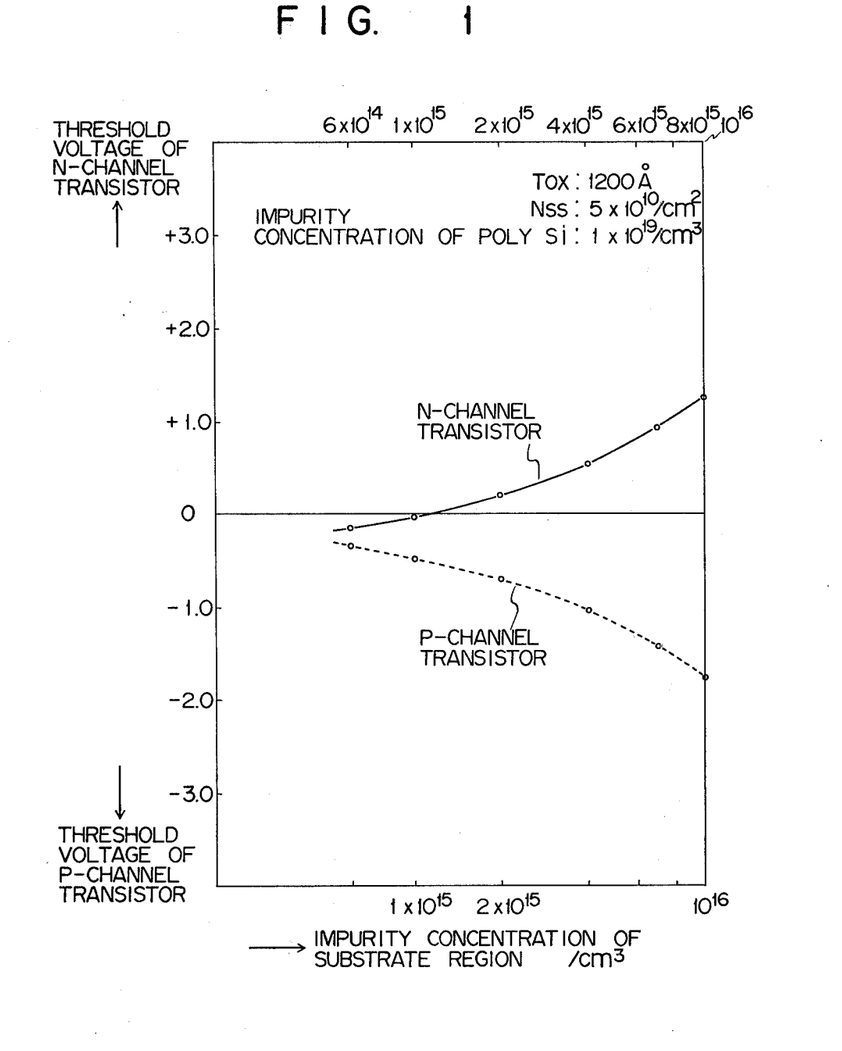
FIG. 1 is a graph showing a relation of the threshold voltage of each transistor to an impurity concentration of a substrate region in a prior art complementary semiconductor device.

Suppose that the threshold voltage of each transistor is controlled to a reasonable value of, for example, ±1.0 volts. If in this case the threshold voltage of both P-and N-channel transistors are to be simultaneously controlled by a one channel doping operation, it is necessary that the impurity concentration of a N-type silicon substrate (i.e. a substrate region of a P-channel type silicon gate field effect transistor) be, for example, about $2 \times 10^{15}$ atoms/cm$^3$ and that the impurity concentration of an island-like P-type region (i.e. substrate region of an N-channel type silicon gate field effect transistor) be a higher value of, for example, about $1 \times 10^{16}$ atoms/cm$^3$. Otherwise it is impossible to simultaneously control the threshold voltages of both transistors. This fact can be seen from FIG. 1 which shows the relationship between the threshold voltage of each transistor and the impurity concentration of the regions in which each transistor is formed.

Since in this way the impurity concentration of the substrate becomes higher, the junction capacitance of source and drain regions of the transistor, as well as the substrate bias effect becomes great. If a random access memory, for example, is constructed using such silicon gate CMOS.IC, a slower access time is involved.

Furthermore, since the polycrystalline silicon layer which serves as a mask in the formation of source and drain regions of each transistor is doped with an impurity of different conductivity type, a direct mutual connection of the polycrystalline silicon layers can not be effected and must be made through an aluminum connection, thus lowering an integration density.

SUMMARY OF THE INVENTION

An object of this invention is to provide a complementary semiconductor device in which the values of the threshold voltages of N-and P-channel type silicon gate field effect transistors can be controlled to a proper value and the junction capacitance of the N-channel type silicon gate field effect transistor, as well as the substrate bias effect, can be decreased.

Another object of this invention is to provide a complementary semiconductor device capable of attaining high integration density.

These and other objects which will be apparent from the following detailed description have been attained according to this invention by a complementary semiconductor device comprising: a semiconductor substrate of one conductivity type having a low impurity concentration; P-and N-type semiconductor regions having substantially the same impurity concentration; an N-channel type silicon gate field effect transistor including source and drain regions in the P-type semiconductor region and a gate region including a gate electrode constituted by a polycrystalline silicon layer; a P-channel type silicon gate field effect transistor including source and drain regions in the N-type semiconductor region and a gate region including a gate electrode comprising a polycrystalline silicon layer, said polycrystalline silicon layer having the same conductivity type as that of the N-channel type transistor; a first impurity layer formed in that portion of the P-type semiconductor region corresponding to the gate region and determining the threshold voltage of said N-channel transistor; and a second impurity layer formed in that portion of the N-type semiconductor region corresponding to the gate region and determining the threshold voltage of said P-channel transistor, said second impurity layer being formed by doping the same conductivity type impurity as that of said first impurity layer.

DETAILED DESCRIPTION OF THE PREFERRED EMBODIMENT

An embodiment of this invention will be explained by referring to the accompanying drawings in which like reference numerals are employed to designate like parts or elements.

Explanation will now be given to a method for the manufacture of a complementary type semiconductor device, by referring to FIGS. 2A through 2J.

Figure 2A:
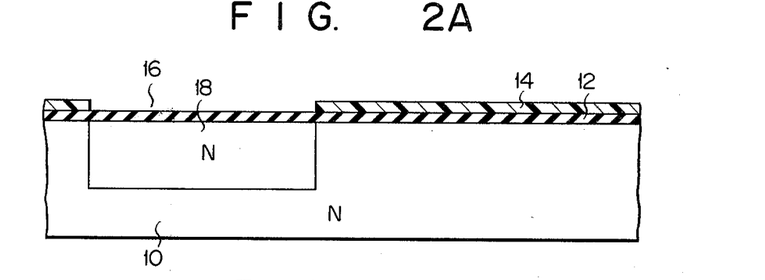
FIGS. 2A to 2J are schematic views showing a process for the manufacture of a complementary semiconductor device according to this invention.

A thin, thermally oxidized film (oxide film) 12 is formed, as shown in FIG. 2A, on the whole surface of an N-type silicon substrate having a low impurity concentration, i.e., about $10^{13}$ to $10^{14}$ atoms/cm$^3$. A photoresist film 14 is formed on the film 12, and an opening 16 is provided in a predetermined portion of the photoresist film 14. With the photoresist film 14 used as a mask for diffusion, phosphorus is doped, by an ion implantation method, through the opening 16 to form an island-like, N-type semiconductor region (N type well) 18 having an impurity concentration of the order of $10^{15}$ atoms/cm$^3$ (usually about $2 \times 10^{15}$ atoms/cm$^3$).

Figure 2B:
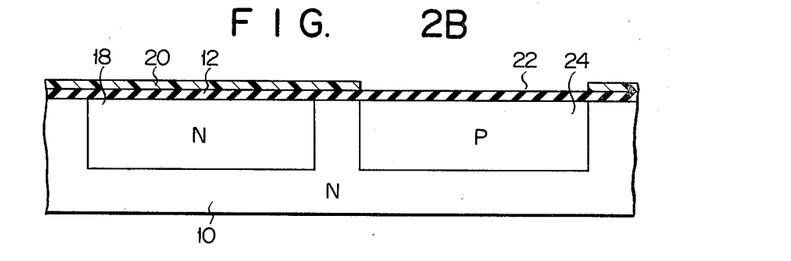

After the photoresist film 14 is removed, a new photoresist film 20 is formed, as shown in FIG. 2B, on the resultant semiconductor structure and an opening 22 is formed in the photoresist film 20. Likewise, boron is doped by the ion implantation method into the semiconductor structure to form an island-like P-type semiconductor region (P-type well) 24. The P-type well 24 is spaced apart from the above-mentioned N-type well 18.

Figure 2C:
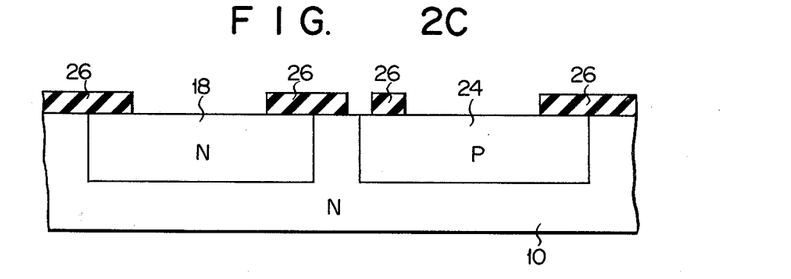

After the photoresist film 20 and oxide film 12 are removed, the whole exposed surface of the semiconductor structure is thermally oxidized to form a relatively thick (usually about 1 μm) field oxide film 26. The field oxide film 26 is removed to expose, as shown in FIG. 2C, those substrate surface portions corresponding to P- and N-channel type field effect transistors to be formed respectively in the N- and P-type wells 18 and 24, as well as that substrate surface portion corresponding to a PN junction, or its neighborhood of the P-type well 24.

Figure 2D:
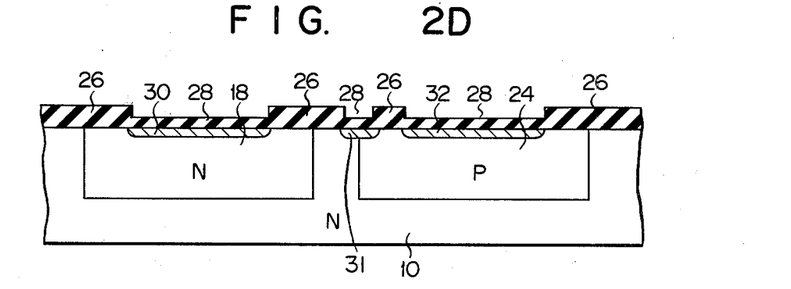

As shown in FIG. 2D, a thermally oxidized film (oxide film) 28 of about 1000 to 1500 Å (for example 1200 Å) is formed on the exposed substrate surface portions. In order to control threshold voltages of transistors to be formed to a proper level as will be described later in detail, P conductivity type impurity such as boron is doped by the ion implantation in those portions corresponding to the N- and P-channels of the substrate to simultaneously form impurity layers 30 and 32. Since the amount of impurity doped is sufficiently smaller than that doped in the formation of source and drain regions to be later formed, it does not matter if such impurity layer is formed on other than a channel region, i.e. in the source and drain regions. Also such impurity layer is formed in the PN junction area as shown at 31.

Figure 2E:
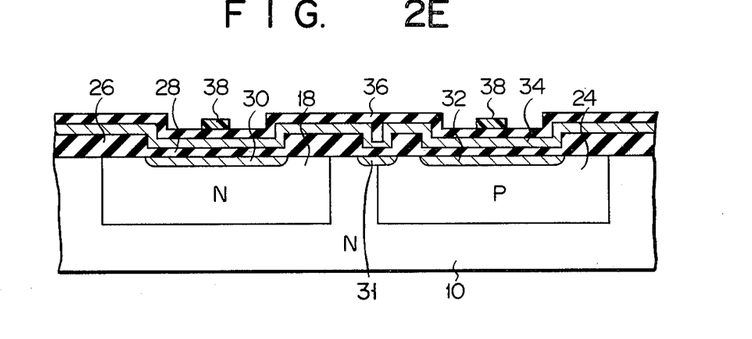

As shown in FIG. 2E a polycrystalline silicon layer 34 with an impurity (phosphorus) concentration of about $1 \times 10^{19}$ atoms/cm$^3$ is formed on the oxide films 26 and 28 and a low-temperature oxide film 36 is formed on the whole surface of the resultant semiconductor structure. Then, a photoresist layer is formed on the oxide film 36 and it is removed except for those portions 38 which correspond to gate regions of the P- and N-channel FET's.

Figure 2F:
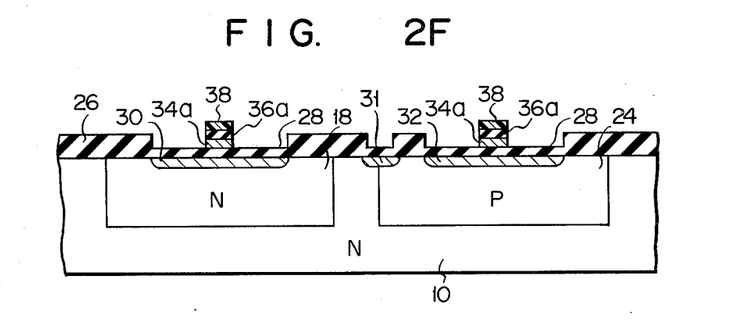
Figure 2G:
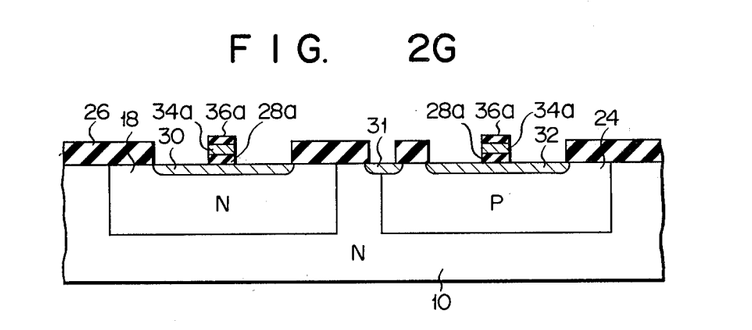

With the photoresist film 38 as a mark, etching is effected to remove the low-temperature oxide film except for those portions under the resist film 38. The polycrystalline silicon layer except for those portions under the remaining low-temperature oxide films 36a is removed by plasma etching (FIG. 2F). Then, the oxide film 28, except for those portions 28a under the remaining polycrystalline layer 34, is removed by etching to expose those substrate surface portions corresponding to the source and drain regions in each of the N- and P-type wells 18 and 24, respectively, as well as that substrate surface portion corresponding to the PN junction area of the P-type well 24. The photoresist layer 38 is etched away (FIG. 2G).

Figure 2H:
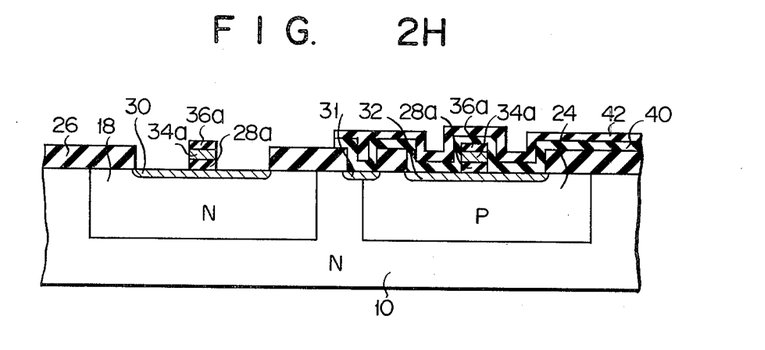

A phosphorus bearing silicon oxide film (PSG) 40 and low-temperature oxide film 42 are formed, in that order, on the whole surface of the resultant semiconductor structure. Then, the PSG film 40 and low-temperature oxide film except for those portions corresponding to the PN junction area of the P-type well 24 are removed as shown in FIG. 2H. With the oxide films 26, 28a and 36a and polycrystalline silicon layer 34a as a mask, boron is diffused in the vapor phase into the N-type well to form P-type source and drain regions 44 and 46 having an impurity concentration of about $1 \times 10^{19}$ atoms/cm$^3$ and a depth of 1 to 2 μm. At the same time, with the oxide films 26, 28a and 36a and polycrystalline silicon layer 34a as a mask, phosphorus is diffused from the PSG film 40 into the P-type well to form N-type source and drain regions 50 and 48 having an impurity concentration of about $1 \times 10^{19}$ atoms/cm$^3$ and a depth substantially equal to that of the P-type source and drain regions 44 and 46. At this time, an N-type region 52 is formed in the PN junction area of the P-type well 24. Since the concentration of the impurity doped in the formation of the source and drain regions is much higher than that of the impurity layers 30 and 32 and of impurity layer 31 formed in the PN junction area of the P-type well 24, semiconductor regions of desired conductivity type are formed without being influenced by the concentration of these impurity layers. In this case, the impurity layer portions under the oxide film 28a are left as channel doped layers 30a and 32a. Then, the oxide films 36a and 42 and PSG film 40 are etched away to provide a semiconductor structure as shown in FIG. 2I.

Figure 2I:
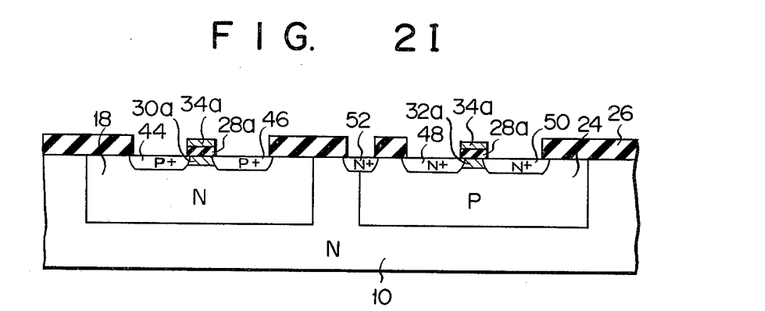
Figure 2J:
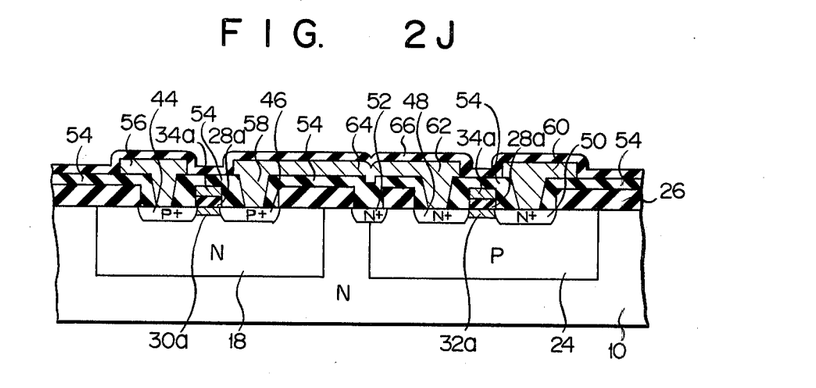

A low-temperature oxide film 54 is formed on the whole surface of the semiconductor structure of FIG. 2I, and the source regions 44, 50 and drain regions 46, 48 of the transistors are partially exposed. Aluminum, for example, is evaporated on the exposed surface of the semiconductor structure to provide source electrodes 56, 60 and drain electrodes 58, 62 of the transistors. The drain electrodes 58 and 62 are connected by an aluminum connection 64. A gate connection electrode is formed simultaneously with the formation of the source and drain electrodes. In this case, the polycrystalline silicon layer 34a is beforehand extended outside of the transistor region and the gate connection electrode is formed at the extension of the silicon layer 34a. A passivation layer 66 is formed on the surface of the semiconductor structure to obtain a silicon gate CMOS.IC as shown in FIG. 2J. Now, explanation will be given to the formation of the channel doped layers 30 and 32 as explained in connection with FIG. 2D.

Figure 3:
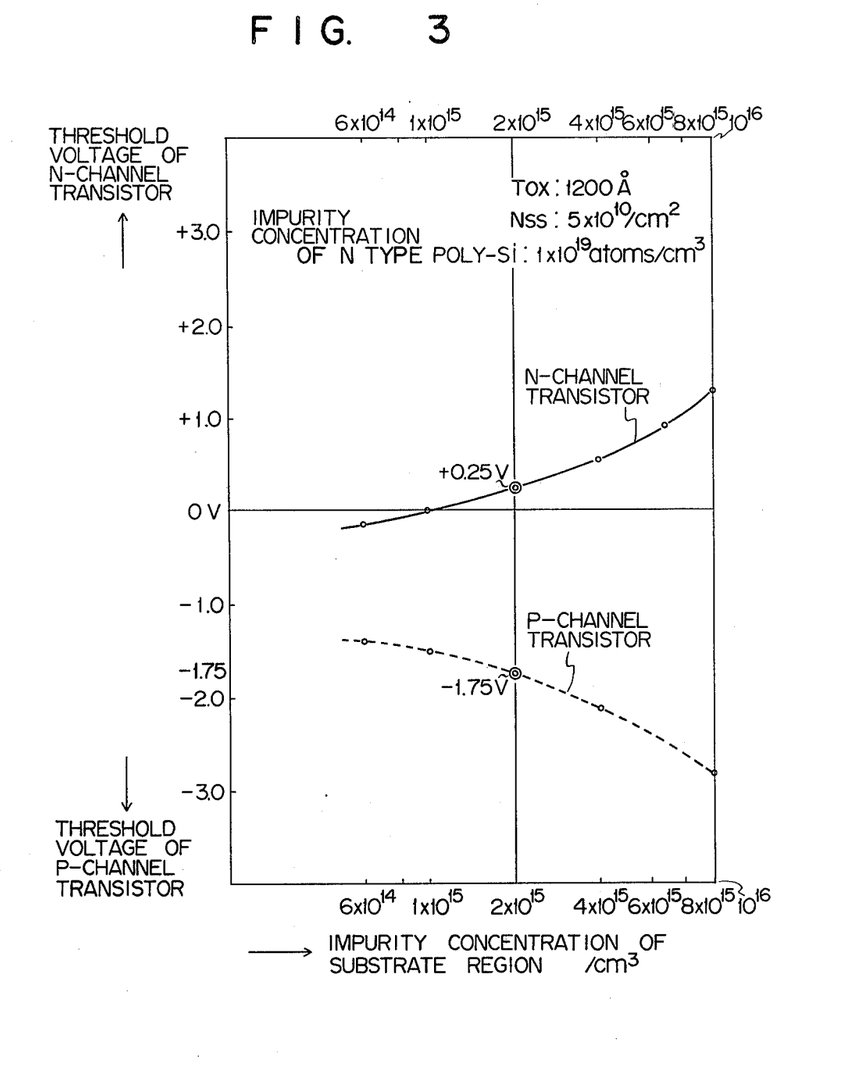
FIGS. 3 and 4 are graphs, each, showing a relation of the threshold voltage of each transistor to an impurity concentration of a substrate in a complementary semiconductor device according to this invention.

Suppose that in the above-mentioned semiconductor device the gate oxide film 28a has a thickness (Tox) of 1200 Å, each polycrystalline silicon layer 34a of the same N conductivity type has an impurity concentration of $1 \times 10^{19}$ atoms/cm$^3$, and that the fixed positive charge density, Nss, is $5 \times 10^{10}$ /cm$^2$. In this case, a relation of the threshold voltage of each transistor to the impurity concentration of the N- and P-type wells is as shown in FIG. 3, provided that such channel doped layer 30 and 32 are not formed. Because the impurity concentration of the N- and P-type wells is $2 \times 10^{15}$ atoms/cm$^3$, the threshold voltages of the N- and P-channel transistors are $+0.25$ volt and $-1.75$ volts, respectively (see FIG. 3). If the absolute values of the threshold voltages of both the transistors are controlled to have a proper value of, for example, $|1.0|V$, all that is necessary is to shift the threshold voltages of both the transistors by 0.75 volt in the positive direction.

In consequence it is only necessary that a dose of boron of about $9.5 \times 10^{10}$ atoms/cm$^2$, i.e. an amount required to shift a threshold voltage of 0.75 volt, be doped at an acceleration voltage of about 55 KeV in the formation of the channel doped layers 30 and 32.

Figure 5:
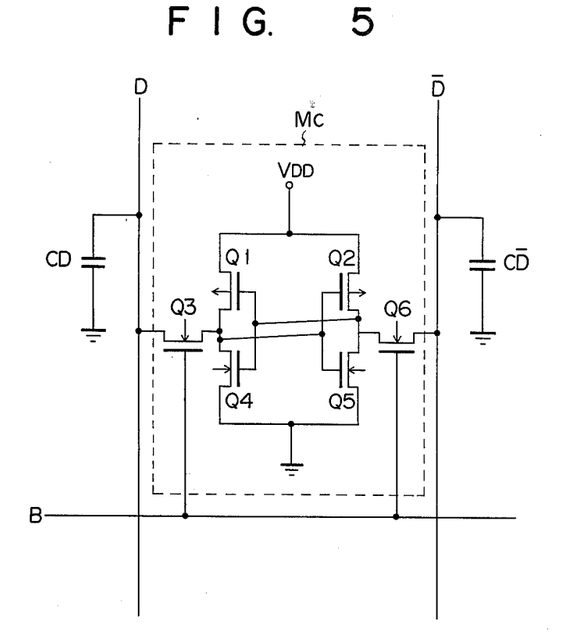
FIG. 5 shows an equivalent circuit showing a silicon gate CMOS random access memory based on the complementary semiconductor device according to this invention.

According to this invention, the N-type silicon substrate has a low concentration of about $10^{13}$ to $10^{14}$ atoms/cm$^3$ and, by so doing, the P-type well which provides a N-channel type silicon gate FET substrate region is formed to have a low concentration of about $2 \times 10^{15}$ atoms/cm$^3$. If the source and drain regions are formed at a dimension of about 30 $\mu$m$\times$20 $\mu$m, the junction capacitance of the source and drain regions of the N-channel type silicon gate FET is about 0.085 PF, a value about 1/2.3 times as low as about 0.19 PF (prior art). The substrate bias effect is also dependent upon the concentration of the P-type semiconductor layer and it is very much smaller than that of the conventional semiconductor device. Where a CMOS circuit such as an inverter circuit, shift register circuit, counter circuit etc. is formed using the semiconductor device of this invention, the operating speed is faster than that of the conventional counterpart and power dissipation resulting from charging and discharging currents becomes very small. A CMOS device of this invention can be advantageously applied to a large bits silicon gate CMOS random access memory. Such a memory has as a basic unit a memory cell unit as shown in FIG. 5. The memory cell unit includes a memory cell Mc including P-channel type silicon gate FET's Q$_1$, Q$_2$ and N-channel type silicon gate FET's Q$_4$, Q$_5$. A pair of switching type silicon gate FET's Q$_3$ and Q$_6$ are connected one between the memory cell Mc and a digit line D and the other between the memory cell Mc and a digit line $\overline{D}$ so as to be opened and closed by a bit signal which is applied to the bit line B. Transistors Q$_3$ and Q$_6$ are preferably made of N-channel types which are faster in switching speed than P-channel types.

Capacitances CD and $\overline{CD}$ connected to the digit lines D and $\overline{D}$ include the junction capacitance of the switching type N-channel type silicon gate FET, gate capacitance of the next stage transistor, capacitance caused by an Al or poly-silicon lead etc. The capacitances CD and $\overline{CD}$ are substantially determined by the junction capacitance of the N-channel type silicon gate FET for switching.

Where, as in a 4K-bit random access memory, for example, 64 N-channel type silicon gate field effect transistors Q$_3$ and Q$_6$ are connected to the digit lines D and $\overline{D}$, the capacitances CD and $\overline{CD}$ become a sum of the junction capacitances of the transistors Q$_3$ and Q$_6$ and, when the conventional CMOS transistor is used, the capacitance will be about 5.4 PF. For the CMOS transistor of this invention, the capacitance is a very small value of about 1.8 PF. Since the substrate bias effect of the N-channel type silicon gate FET becomes small as already set out above, a very fast access time is obtained.

According to this invention the silicon gate electrodes of the N- and P-channel type silicon gate FET's are of the same conductivity type. Where the gate electrodes of the N- and P-channel type silicon gate FET's are connected in common and the common connection is used as an input terminal, it is necessary in the conventional method to connect together the gate electrodes through an Al connection and thus a greater area is required to provide a contact portion. According to this invention, on the other hand, a high integration density can be attained, because it is not necessary to connect together the gate electrodes through the Al connection: they can be directly connected together.

Figure 4:
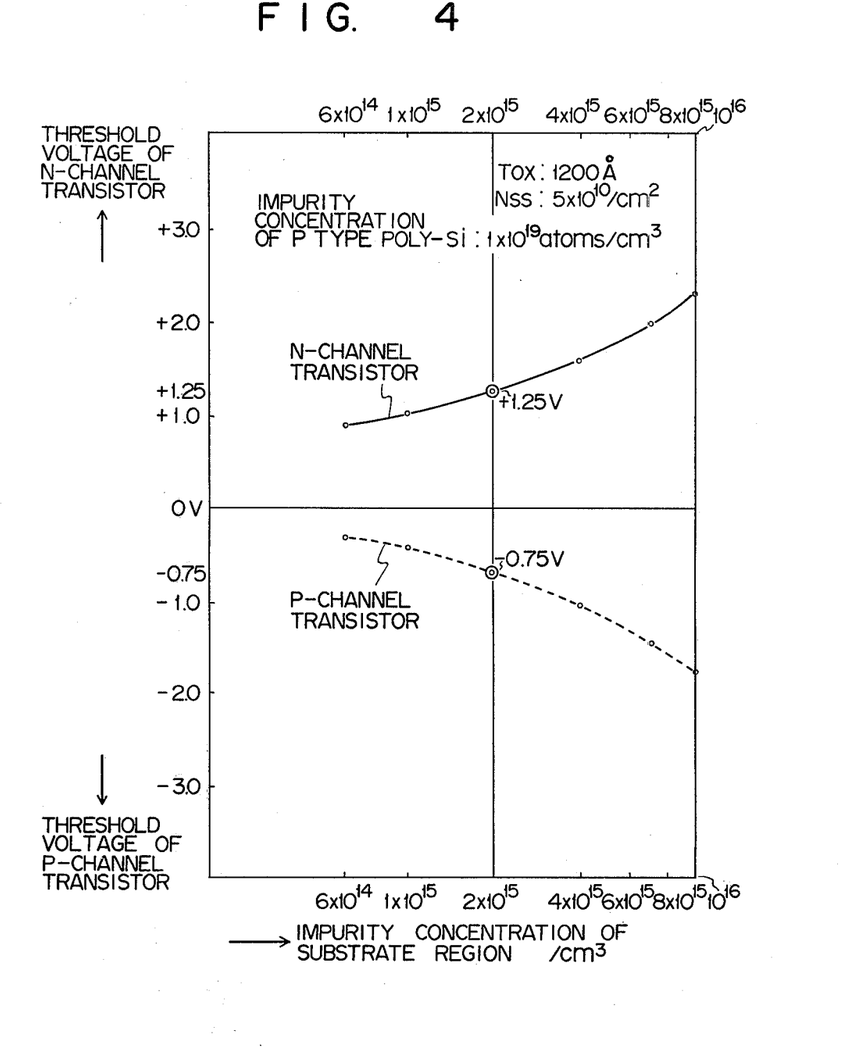

Although in the above-mentioned embodiment the silicon gate electrode of each transistor is a phosphorus containing N-type, it can be a boron-containing P-type with the same impurity concentration (i.e. $1 \times 10^{19}$ atoms/cm$^3$). In this case, a relation of the threshold voltage of each transistor to the impurity concentration of the N- and P-type wells will be as shown in FIG. 4, provided that the other conditions are identical. When the impurity concentration of each well is $2 \times 10^{15}$ atoms/cm$^3$, the threshold voltages of the N- and P-channel type FET's are about $+1.25$ volts and about $-0.75$ volt, respectively. In order to let the absolute values of the threshold voltages of both the transistors to be controlled to a proper, mutually equal value of $|1.0|$, a dose of phosphorus of about $9 \times 10^{10}$ atoms/cm$^2$, i.e. an amount necessary to shift threshold voltage by 0.25 volt in the same negative direction, is doped at the acceleration voltage of about 130 KeV to simultaneously form channel doped layers.

Although in the above-mentioned embodiment the channel doped layer is formed after the gate oxide film has been formed, it can be formed before the formation of the gate oxide film. While the polycrystalline silicon is subjected to patterning using the plasma etching method, patterning can be freely effected by an ordinary etching method with a nitride film as a mask. This invention can also be applied to a semiconductor thin film on an insulating substrate such as sapphire, spinel etc.

Figure 6:
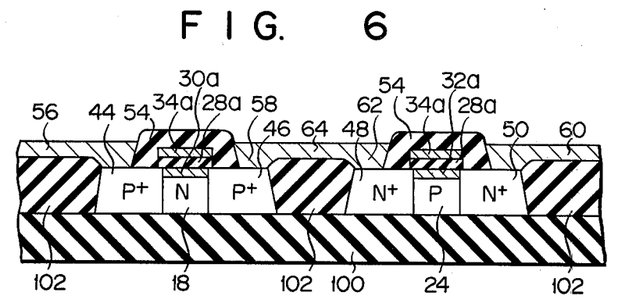
FIG. 6 is a schematic view showing a complementary semiconductor device according to another embodiment of this invention.

FIG. 6 shows an embodiment in which N- and P-type semiconductor regions 18 and 24 are separately formed by an insulator 102 on an insulating substrate 100 such as sapphire, spinel etc. and a predetermined silicon gate FET is formed in each of the semiconductor regions 18 and 24.

What we claim is:

1. A complementary semiconductor device comprising a semiconductor substrate of one conductivity type having a low impurity concentration; P -and N-type semiconductor regions formed in said substrate and having substantially the same impurity concentration; an N-channel type silicon gate field effect transistor including source and drain regions formed in said P-type semiconductor region and a gate region including a gate electrode comprising a polycrystalline silicon layer of one conductivity type; a P-channel type silicon gate field effect transistor including source and drain regions formed in said N-type semiconductor region and a gate region including a gate electrode comprising a polycrystalline silicon layer, said polycrystalline silicon layer being of the same conductivity type as that of said polycrystalline silicon layer of said N-channel transistor; a first impurity layer formed in that portion of the P-type semiconductor region which corresponds to said gate region and determining the threshold voltage of said N-channel transistor; and a second impurity layer formed in that portion of the N-type semiconductor region which corresponds to said gate region and determining the threshold voltage of said P-channel transistor, said second impurity layer being formed by doping the same conductivity type impurity as that of said first impurity layer.

2. A complementary semiconductor device according to claim 1, in which the gate region includes an oxide layer formed under the polycrystalline silicon layer.

3. A complementary semiconductor device according to claim 2, in which said semiconductor substrate has an impurity concentration of about $10^{13}$ to $10^{14}$ atoms/cm$^3$.

4. A complementary semiconductor device according to claim 3, in which said P- and N-type semiconductor regions have an impurity concentration of the order of $10^{15}$ atoms/cm$^3$.

5. A complementary semiconductor device according to claim 1, in which the polycrystalline silicon layers are of an N-conductivity type.

6. A complementary semiconductor device according to claim 5, in which the impurity layer is formed by doping a P-conductivity type impurity.

7. A complementary semiconductor device according to claim 1, in which the polycrystalline silicon layers are of a P-conductivity type.

8. A complementary semiconductor device according to claim 7, in which the impurity layer is formed by doping a N-conductivity type impurity.

9. A complementary semiconductor device according to claim 1, in which the impurity layers include an impurity enough to make the absolute value of threshold voltages of the N- and P-channel type transistors equal to each other.

10. A complementary semiconductor device according to claim 1, in which said semiconductor substrate is formed on an insulating substrate.

11. A complementary semiconductor device according to claim 1, in which said P- and N-type semiconductor regions are mutually separated by an insulator.

* * * * *